US010647812B2

(12) United States Patent
Anthamatten et al.

(10) Patent No.: US 10,647,812 B2
(45) Date of Patent: May 12, 2020

(54) SHAPE-MEMORY POLYMERS AND METHODS OF MAKING AND USE THEREOF

(71) Applicant: THE UNIVERSITY OF ROCHESTER, Rochester, NY (US)

(72) Inventors: Mitchell Anthamatten, Rochester, NY (US); Yuan Meng, Rochester, NY (US)

(73) Assignee: The University of Rochester, Rochester, NY (US)

( * ) Notice: Subject to any disclaimer, the term of this patent is extended or adjusted under 35 U.S.C. 154(b) by 0 days.

(21) Appl. No.: 15/579,629

(22) PCT Filed: Jun. 6, 2016

(86) PCT No.: PCT/US2016/035979
§ 371 (c)(1),
(2) Date: Dec. 5, 2017

(87) PCT Pub. No.: WO2016/197087
PCT Pub. Date: Dec. 8, 2016

(65) Prior Publication Data
US 2018/0155492 A1 Jun. 7, 2018

Related U.S. Application Data

(60) Provisional application No. 62/171,675, filed on Jun. 5, 2015.

(51) Int. Cl.
C08G 63/00 (2006.01)
C08G 63/688 (2006.01)
C08G 63/08 (2006.01)
C08G 63/91 (2006.01)
G01N 25/48 (2006.01)
G01R 33/46 (2006.01)

(52) U.S. Cl.
CPC ......... C08G 63/6882 (2013.01); C08G 63/08 (2013.01); C08G 63/912 (2013.01); C08G 2280/00 (2013.01); G01N 25/4866 (2013.01); G01R 33/46 (2013.01)

(58) Field of Classification Search
CPC .. C08G 63/6882; C08G 63/08; C08G 63/912; C08G 2280/00; G01R 33/46; G01N 25/4866
USPC ......................................................... 528/59
See application file for complete search history.

(56) References Cited

U.S. PATENT DOCUMENTS

| | | | |
|---|---|---|---|
| 6,114,499 A | 9/2000 | Kazmaier et al. | |
| 6,324,703 B1* | 12/2001 | Chen | C08L 51/00 128/857 |
| 6,333,374 B1* | 12/2001 | Chen | A61C 15/00 524/270 |
| 7,935,131 B2* | 5/2011 | Anthamatten | C08L 53/00 128/864 |
| 8,172,873 B2* | 5/2012 | Anthamatten | C08F 285/00 128/864 |
| 8,901,253 B2 | 12/2014 | Behl et al. | |
| 9,404,009 B2* | 8/2016 | Kou | C08F 2/00 |
| 9,598,534 B2* | 3/2017 | Anthamatten | C08J 3/243 |
| 10,227,446 B2* | 3/2019 | Nurmi | C08G 18/4283 |
| 2007/0148465 A1 | 6/2007 | Shimura et al. | |
| 2010/0311861 A1 | 12/2010 | Clapper et al. | |
| 2013/0149312 A1 | 6/2013 | Finch et al. | |
| 2013/0277890 A1 | 10/2013 | Bowman | |
| 2014/0107312 A1 | 4/2014 | Hu et al. | |
| 2015/0065414 A1 | 3/2015 | Long et al. | |
| 2016/0009863 A1 | 1/2016 | Yakacki et al. | |
| 2018/0086878 A1* | 3/2018 | Anthamatten | C08G 63/08 |

FOREIGN PATENT DOCUMENTS

| | | |
|---|---|---|
| CN | 102786648 A | 11/2012 |
| DE | 102008055870 | 5/2010 |
| WO | 2004033515 | 4/2004 |
| WO | 2011003832 | 1/2011 |

OTHER PUBLICATIONS

Ahir, S. V. et al., "Self-assembled shape-memory fibers of triblock liquid-crystal polymers", Adv Funct Mater 2006, 16 (4), 556-560.
Ahmad et al. "Synthesis and Characterization of Polyurethane-Based Shape-Memory Polymers for Tailored T-g around Body Temperature for Medical Applications". Macromolecular Chemistry and Physics, 2011. 212(6): p. 592-602.
An et al. "Thermal behaviour of poly(eta-captolactone)-poly(ethylene glycol)-poly(eta-captolacton) tri-block copolymers." J. Mat. Sci. 2001, 36, 715-722.
Andrews, R. D. et al., "The theory of permanent set at elevated temperatures in natural and synthetic rubber vulcanizates", J Appl Phys 1946, 17 (5), 352-361.
Anthamatten, M. et al., "Energy storage capacity of shape-memory polymers", Macromolecules 2013, 46 (10), 4230-4234.
Behl, M. et al., "Reversible bidirectional shape-memory polymers", Adv Mater 2013, 25 (32), 4466-4469.

(Continued)

Primary Examiner — Douglas J McGinty
(74) Attorney, Agent, or Firm — Meunier Carlin & Curfman LLC

(57) ABSTRACT

Described are shape-memory polymers that have a composite prepolymer crosslinked with a stoichiometric amount of a multifunctional crosslinker, the composite prepolymer having a branched or telechelic prepolymer having a low polydispersity reacted with a non-crystalline chain extender. Also described are methods of making shape-memory polymers by reacting a branched or telechelic prepolymer having a low polydispersity with a non-crystalline chain extender to form a composite prepolymer, and crosslinking a stoichiometric amount of a multifunctional crosslinker with the composite prepolymer, thereby forming the shape-memory polymer.

16 Claims, 8 Drawing Sheets

(56) References Cited

OTHER PUBLICATIONS

Berg, G. J. et al., "New directions in the chemistry of shape memory polymers", Polymer 2014, 55 (23).
Brommel, F. et al., "Preparation of liquid crystalline elastomers", Adv Polym Sci 2012, 250, 1-48.
Chatani, S. et al., "Triple shape memory materials incorporating two distinct polymer networks formed by selective thiol-michael addition reactions", Macromolecules 2014, 47 (15), 4949-4954.
Chatterjee, T. et al., "Hierarchical polymer-nanotube composites", Adv Mater 2007, 19 (22), 3850-3853.
Chen, S. J. et al., "Properties and mechanism of two-way shape memory polyurethane composites", Compos Sci Technol 2010, 70 (10), 1437-1443.
Chung, T. et al., "Clinical Comparison of the Auditory Steady-State Response with the Click Auditory Brainstem Response in Infants", Clin Exp Otorhinolaryngol 2008, 1 (4), 184-188.
Erkoc et al. "Mixing dynamics control in RIM machines" Chem Eng Sci, 2007, 18-20, 5276-5281.
Floudas, G. et al., "Shear-induced crystallization of poly(epsilon-caprolactone). 2. Evolution of birefringence and dichroism", Macromolecules 2000, 33 (17), 6466-6472.
Fridman et al. "Morphological characterization of reaction injection moulded (RIM) polyester-based polyurethanes", Polymer, 1980, 4, 393-402.
Gasman L et al. Markets for Shape Memory Polymers:2016-2025. n-tech Research, 2016, Summary only.
Gomes et al. "Real time control of mixing in Reaction Injection Moulding", Chem Eng Res Des, 2016, 31-43.
Hearon et al. "Electron Beam Crosslinked Polyurethane Shape Memory Polymers with Tunable Mechanical Properties", Macromol Chem Phys, 2013, 11, 1258-1272.
Heuwers et al. "Stress-Induced Melting of Crystals in Natural Rubber: a New Way to Tailor the Transition Temperature of Shape-memory Polymers". Macromolecular Rapid Communications, 2012. 33(18): p. 1517-1522.
Heuwers et al. "Shape-Memory Natural Rubber: An Exceptional Material for Strain and Energy Storage". Macromolecular Chemistry and Physics, 2013. 214(8): p. 912-923.
Huang, W. M. et al., "Water-driven programmable polyurethane shape memory polymer: Demonstration and mechanism", Appl Phys Lett 2005, 86 (11), 114105-114105-3.
Kamal, T. et al., "Uniaxial tensile deformation of poly(epsilon-caprolactone) studied with saxs and waxs techniques using synchrotron radiation", Macromolecules 2012, 45 (21), 8752-8759.
Kang et al, Two-way actuation behavior of shape memory polymer/ elastomer core/shell composites, Feb. 25, 2012, Smart Mater. Struc. 21, 1-7.
Katzenberg et al. "Superheated Rubber for Cold Storage". Advanced Materials, 2011. 23(16): p. 1909-1911.
Koo et al. "Reaction Injection Molding of Polyurethane Foam for Improved Thermal Insulation", Polym Eng Sci, 2001, 7, 1177-1186.
Kramer, O. et al., "Entanglement networks of 1,2-polybutadiene crosslinked in states of strain .1. Crosslinking at 0 degrees" Macromolecules 1974, 7 (1), 79-84.
Kricheldorf, HR et al. "Telechelic and Star-Shaped Poly(alpha-caprolactone) Functionalized with Triethoxysilyl Groups—New Biodegradable Coatings and Adhesives", Macromol Chem Phys 2005, 206(7), 758-766.
Lapprand et al. "Reactivity of isocyanates with urethanes: Conditions for allophanate formation", Plym Degrad Stabil, 2005, 2, 363-373.
Lee et al. "Polycaprolactone—POSS Chemical / Physical Double Networks", Macromolecules 2008, 41, 4730-4738.
Lendlein, A. et al., "Light-induced shape-memory polymers", Nature 2005, 434 (7035), 879-882.
Lewis et al. Well-Defined Shape-Memory Networks with High Elastic Energy Capacity. Macromolecules, 2015, 14, 4918.
Li et al. "Effect of Crosslink Density on the Morphology and Properties of Reaction-Injection-Molding Poly(urethane urea) Elastomers", J Polymer Sci Pol Chem 2004, 5, 1126-1131.
Lu et al. "Reactivity of Common Functional Groups with Urethanes: Models for Reactive Compatibilization of Thermoplastic Polyurethane Blends", J Polym Sci Pol Chem 2002, 14, 2310-2328.
Luo, X. F. et al., "Triple-shape polymeric composites (tspcs)", Adv Funct Mater 2010, 20 (16), 2649-2656.
Luo, Y. W. et al., "A general approach towards thermoplastic multishape-memory polymers via sequence structure design", Adv Mater 2013, 25 (5), 743-748.
Meng et al. "Shape Actuation via Internal Stress-Induced Crystallization of Dual-Cure Networks", ACS Macro Lett, 2015, 1, 115-118.
Meng et al. "Body Temperature Triggered Shape-Memory Polymers with High Elastic Energy Storage Capacity", J Polym Sci Pol Phys, 2016, 14, 1397-1404.
Meng et al. "Photoinscription of Chain Anisotropy into Polymer Networks", Macromolecules, 2016, 23, 9100-9107.
Michal, B.T. et al., "Inherently Photohealable and Thermal Shape-Memory Polydisulfide Networks", ACS Macro Letters / American Chemical Society, vol. 2, No. 8, Aug. 20, 2013, pp. 694-699.
Mohr, R. et al., "Initiation of shape-memory effect by inductive heating of magnetic nanoparticles in thermoplastic polymers", P Natl Acad Sci USA 2006, 103 (10), 3540-3545.
Nunes et al. "Micromixing assessment of confined impinging jet mixers used in RIM", Chem Eng Sci, 2012, 276-286.
Ohm, C. et al., "Liquid crystalline elastomers as actuators and sensors", Adv Mater 2010, 22 (31), 3366-3387.
Roland, C. M. et al., "Orientation effects in rubber double networks", Rubber Chem Technol 1990, 63 (2), 285-297.
Shafagh et al. NANORIM: Sub-micron structuring with reaction injection molding, 30th IEEE International Conference on Micro Electro Mechanical Systems, 2017, IEEE:Las Vegas, NV, p. 213-216.
Simon et al., "A comparison of polymer substrates for photolithographic processing of flexible bioelectrics", Biomed Microdevices 2013, 15, 925-939.
Singh, N. K. et al., "A Physical and mechanical study of pre-stressed competitive double network thermoplastic elastomers", Macromolecules 2011, 44, 1480-1490.
Singh, N. K. et al., "Mechanical and thermo-mechanical studies of double networks based on thermoplastic elastomers", J Polym Sci Pol Phys 2010, 48 (7),778-789.
Spruiell, J. E. et al., "The specification of orientation and its development in polymer processing", Polymer Engineering and Science 1982, 23 (5), 247-256.
Torbati, A. H. et al., "Properties of triple shape memory composites prepared via polymerization-induced phase separation", Soft Matter 2014, 10 (17), 3112-3121.
Twardowski, T. et al., "Elastic contributions from chain entangling and chemical cross-links in elastomer networks in the small-strain limit", Macromolecules 1991, 24 (21), 5769-5771.
Westbrook, K. K. et al., "Two-way reversible shape memory effects in a free-standing polymer composite", Smart Mater Struct 2011, 20 (6).
Woodruff et al. "The return of a forgotten polymer—Polycaprolactone in the $21^{st}$ century", Prog Polym Sci, 2010, 10, 1217-1256.
Xie, T., "Tunable polymer multi-shape memory effect", Nature 2010, 464 (7286), 267-270.
Xu et al. "High performance shape-memory polymer networks based on rigid nanoparticle cores". Proceedings of the National Academy of Sciences of the United States of America, 2010. 107(17): p. 7652-7657.
Xue et al. "Synthesis and Characterization of Three-Arm Poly(epsilon-caprolactone)-Based Poly(ester-urethanes) with Shape-Memory Effect at Body Temperature". Macromolecules, 2009. 42(4): p. 964-972.
Zhao, Y. et al., "Crystallization under strain and resultant orientation of poly(epsilon-caprolactone) in miscible blends", Macromolecules 1999, 32 (4), 1218-1225.
Zotzmann, J. et al., "Reversible triple-shape effect of polymer networks containing polypentadecalactone- and poly(epsilon-caprolactone)-segments", Adv Mater 2010, 22 (31), 3424-3429.
Database WPI XP002761593, Week 201327, Thomson Scientific, London, GB, Nov. 21, 2012, 2 pages.

(56) References Cited

OTHER PUBLICATIONS

International Search Report and Written Opinion dated Aug. 17, 2016, from International Application No. PCT/US2016/018720, 17 pages.
International Search Report and Written Opinion dated Sep. 16, 2016, from International Application No. PCT/US2016/035979, 12 pages.

* cited by examiner

Before drawing:
*crystal-free*

When drawn:
*strain-induced crystallization*

SHAPE-MEMORY POLYMERS AND METHODS OF MAKING AND USE THEREOF

CROSS-REFERENCE TO RELATED APPLICATIONS

This application is a 371 U.S. National Stage of International Application No. PCT/US2016/035979, filed Jun. 6, 2016, which claims benefit of U.S. Provisional Application No. 62/171,675 filed on Jun. 5, 2015, each of which are hereby incorporated herein by reference in their entireties.

BACKGROUND

Shape-memory polymers (SMPs) form a class of materials that can store and release elastic energy upon applying an external stimulus, such as heat or light. A shape-memory material can be deformed to a temporary shape and can return to its original shape after the application of the external stimulus. For example, a material heated above its shape-memory transition temperature, $T_{SM}$, can be elastically deformed by subjecting it to external stresses and subsequently cooled, while under stress, beneath $T_{SM}$. In the cooled state, external stresses can be removed and the material can retain its deformed shape. Upon heating above $T_{SM}$, the material can recover its elastic strain energy and can return to its original shape. SMPs are noted for their ability to recover from large strains—up to several hundred percent—which can be imposed by mechanical loading. The large-strain recovery observed in SMPs is a manifestation of entropy elasticity.

SMPs can serve in biomedical devices such as vascular stents, clot-removal devices, catheters, programmable sutures, implants, and numerous other applications. Applications increasingly demand that shape-memory materials perform mechanical work against external loads; therefore, SMPs, in certain circumstances, should exhibit high shape energy densities. Other commercialization desires are diverse but can include: (i) a specified shape recovery stimulus (heat, light, chemical); (ii) ease of processability into different shapes; (iii) reproducible and robust shape-memory behavior upon cycling; and (iv) and low cost and straightforward scale-up.

One particularly desirable characteristic is a tunable shape recovery temperature, $T_{SM}$, near the body's temperature. Most accessible thermally induced shape-memory polymers have a high modulus and require high triggering temperatures ($T_{trig}$~50-90° C.). For example poly(caprolactone) (PCL), poly(ω-pentadecalactone)(PPD), and poly(ester urethane) (PEU) have melting temperatures of ~60° C., ~75° C., and ~45-60° C., respectively, and poly(lactide)(PLA) has a glass transition temperature ($T_g$) of ~53° C. (Zotzmann J et al. *Advanced Materials*, 2010, 22(31), 3424-3429; Ahmad M et al. *Macromolecular Chemistry and Physics*, 2011, 212(6), 592-602; Xue L et al. *Macromolecules*, 2009, 42(4), 964-972). All these examples have thermal transitions well above the human body temperature (>35° C.), which prohibits these polymers from being useful for many potential biomedical applications.

There have been several attempts to realize body temperature triggered shape-memory behavior. For example, PEUs undergo phase-segregation into nanoscale hard and soft segment domains to form thermoplastic shape-memory materials that can resist mechanical creep. The shape-memory trigger temperature of these PEUs can be reduced by incorporating low molar mass crystallizable soft segments (Lendlein A and Langer R. *Science*, 2002, 296(5573), 1673-1676) or by manipulating the size of phase-segregated hard segment domains (Ahmad M et al. *Macromolecular Chemistry and Physics*, 2011, 212(6), 592-602; Xue L et al. *Macromolecules*, 2009, 42(4), 964-972). Another way to reduce the shape-memory transition temperature is to create a network polymer with well distributed net points. For example, Xu et al. prepared a network made of star-shaped PLA with a bulky and rigid nanoparticle POSS core, which reportedly lowered the excessive global entanglement of the tethered network chains and hence lowered the transition temperature by 20° C. (Xue J W and Song J. *PNAS*, 2010, 107(17), 7652-7657). While these approaches can have promise in some applications, new SMP's with transitions at or near body temperature are still needed. The methods and compositions disclosed herein address these and other needs.

SUMMARY

In accordance with the purposes of the disclosed methods, as embodied and broadly described herein, the disclosed subject matter relates to compositions and methods of making and using the compositions. More specifically, disclosed herein are shape-memory polymers and methods of making shape-memory polymers. According to further aspects, the disclosed subject matter relates to shape-memory polymers that can be deformed at or beneath room temperature and returned to their original shape when at body temperature or higher. The disclosed shape-memory polymers can comprise a composite prepolymer crosslinked with a stoichiometric amount of a multifunctional crosslinker, wherein said composite prepolymer can comprise a branched or telechelic prepolymer having a low polydispersity reacted with a non-crystalline chain extender. In some examples, the disclosed shape-memory polymers can further comprise radical scavengers.

Also disclosed herein are methods of making shape-memory polymers. The disclosed methods can comprise, for example, reacting a branched or telechelic prepolymer having a low polydispersity with a non-crystalline chain extender to form a composite prepolymer, and crosslinking a stoichiometric amount of a multifunctional crosslinker with the composite prepolymer, thereby forming the shape-memory polymer. The disclosed methods can also be performed in the presence of a radical scavenger.

Additional advantages will be set forth in part in the description that follows or may be learned by practice of the aspects described below. The advantages described below will be realized and attained by elements and combinations particularly pointed out in the appended claims. It is to be understood that both the foregoing general description and the following detailed description are exemplary and explanatory only and are not restrictive.

BRIEF DESCRIPTION OF THE FIGURES

The accompanying figures, which are incorporated in and constitute a part of this specification, illustrate several aspects described below.

DETAILED DESCRIPTION

Figure 1:
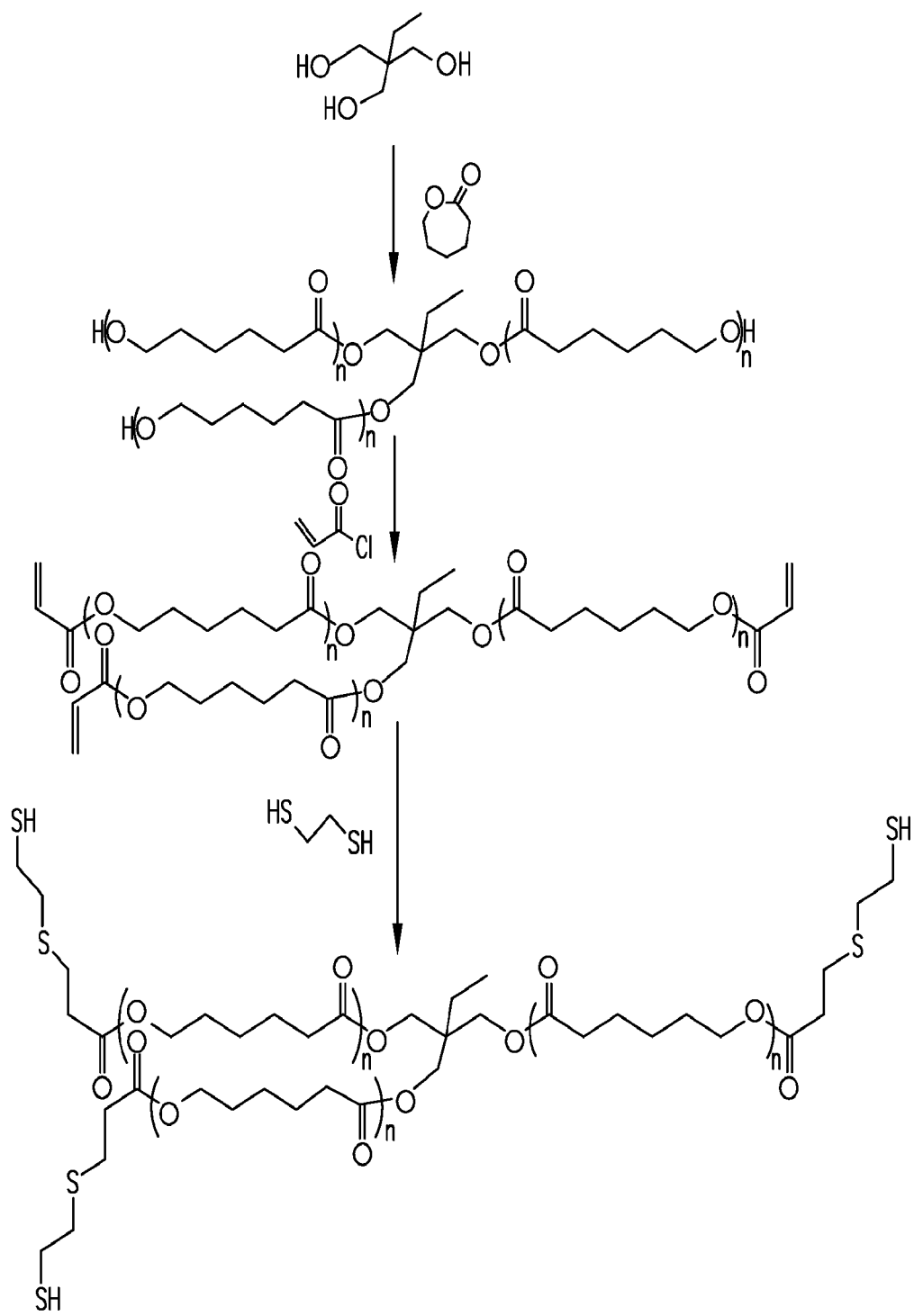
FIG. 1 displays a general synthesis strategy for the poly(caprolactone) (PCL) shape-memory polymers.

The methods and compositions described herein may be understood more readily by reference to the following detailed description of specific aspects of the disclosed subject matter and the Examples included therein.

Before the present methods and compositions are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

"Optional" or "optionally" means that the subsequently described event or circumstance can or cannot occur, and that the description includes instances where the event or circumstance occurs and instances where it does not.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

By "substantially the same" is meant the values are within 5% of one another, e.g., within 3%, 2% or 1% of one another.

As used herein, "molecular weight" refers to number-average molecular weight as measured by $^1$H NMR spectroscopy, unless clearly indicated otherwise.

Disclosed herein are shape-memory polymers. The disclosed shape-memory polymers can comprise a composite prepolymer crosslinked with a stoichiometric amount of a multifunctional crosslinker, wherein said composite prepolymer can comprise a branched or telechelic prepolymer having a low polydispersity reacted with a non-crystalline chain extender. In the disclosed shape-memory polymers, the triggering temperature is at our about body temperature (37° C.). For example, the triggering temperature can be from 30 to 45° C., from 35 to 40°, from 30 to 40° C., or from 35 to 45° C. In other examples, the triggering temperature can be 30, 31, 32, 33, 34, 35, 36, 37, 38, 39, 40, 41, 42, 43, 44, or 45° C., where any of the stated values can form an upper or lower endpoint of a range.

The term "branched prepolymer" is used herein to refer to a branched polymer before it has undergone a reaction as disclosed herein. It is not meant to imply that the branched prepolymer is not yet a polymer (e.g., a monomer or polymer precursor). Rather a branched prepolymer is meant to refer to a branched polymer that has reactive groups that are available for bond forming reactions. In some examples, the branched prepolymer can comprise 3 or more branches (e.g., 4 or more, 5 or more, 6 or more, 7 or more, 8 or more, or 9 or more). In some examples, the branched prepolymer can comprise 10 or less branches (e.g., 9 or less, 8 or less, 7 or less, 6 or less, 5 or less, or 4 or less). The number of branches in the branched prepolymer can range from any of the minimum values described above to any of the maximum values described above, for example from 3 to 10 (e.g., from 3 to 7, from 7 to 10, or from 4 to 9).

The term "telechelic prepolymer" is used herein to refer to a compound, including a polymer that is functionalized at each end of the molecule and thus can enter into polymerization or other reactions through its functionalized, reactive end-groups.

The terms "low polydispersity" and "substantially monodisperse" are used interchangeably to refer to a polydispersity index (PDI), defined as the ratio of the weight average molecular weight to the number average molecular weight, of from 1 to 2.0. In some examples, the molecular weight of the branched prepolymer or telechelic prepolymer can be 6,000 grams per mole (g/mol) or less (e.g., 5,750 g/mol or less; 5,500 g/mol or less; 5,250 g/mol or less; 5,000 g/mol or less; 4,750 g/mol or less; 4,500 g/mol or less; 4,250 g/mol or less; 4,000 g/mol or less; 3,750 g/mol or less; 3,500 g/mol or less; 3,250 g/mol or less; 3,000 g/mol or less; 2,750 g/mol or less; 2,500 g/mol or less; or 2,250 g/mol or less). In some examples, the molecular weight of the branched prepolymer or telechelic prepolymer can be 2,000 g/mol or more (e.g., 2,250 g/mol or more; 2,500 g/mol or more; 2,750 g/mol or more; 3,000 g/mol or more; 3,250 g/mol or more; 3,500 g/mol or more; 3,750 g/mol or more; 4,000 g/mol or more; 4,250 g/mol or more; 4,500 g/mol or more; 4,750 g/mol or more; 5,000 g/mol or more; 5,250 g/mol or more; 5,500 g/mol or more; or 5,750 g/mol or more). The molecular weight of the branched prepolymer or telechelic prepolymer can range from any of the minimum values described above to any of the maximum values described above, for example from 2,000 g/mol to 6,000 g/mol (e.g., from 2,000 g/mol to 4,000 g/mol; from 4,000 g/mol to 6,000 g/mol; from 2,000 to 2,500 g/mol; from 2,500 g/mol to 3,000 g/mol; from 3,000 g/mol to 3,500 g/mol; from 3,500 g/mol to 4,000 g/mol; from 4,000 g/mol to 4,500 g/mol; from 4,500 g/mol to 5,000 g/mol; from 5,000 g/mol to 5,500 g/mol, from 5,500 g/mol to 6,000 g/mol, or from 3,500 g/mol to 5,500 g/mol).

In some examples, each branch of the branched prepolymer or telechelic prepolymer is substantially the same molecular weight. In other words, in some examples within each branched prepolymer or telechelic prepolymer the branches have a low polydispersity. In some examples, the molecular weight of each branch of the branched prepolymer or telechelic prepolymer can be 2,000 grams per mole (g/mol) or less (e.g., 1,950 g/mol or less; 1,900 g/mol or less; 1,850 g/mol or less; 1,800 g/mol or less; 1,750 g/mol or less; 1,700 g/mol or less; 1,650 g/mol or less; 1,600 g/mol or less; 1,550 g/mol or less; 1,500 g/mol or less; 1,450 g/mol or less; 1,400 g/mol or less; 1,350 g/mol or less; 1,300 g/mol or less; 1,250 g/mol or less; 1,200 g/mol or less; 1,150 g/mol or less; 1,100 g/mol or less; 1,050 g/mol or less; 1,000 g/mol or less; 950 g/mol or less; 900 g/mol or less; 850 g/mol or less; 800 g/mol or less; 750 g/mol or less; or 700 g/mol or less). In some examples, the molecular weight of each branch of the branched prepolymer or telechelic prepolymer can be 650 g/mol or more (e.g., 700 g/mol or more; 750 g/mol or more; 800 g/mol or more; 850 g/mol or more; 900 g/mol or more; 1,000 g/mol or more; 1,050 g/mol or more; 1,100 g/mol or more; 1,150 g/mol or more; 1,200 g/mol or more; 1,250 g/mol or more; 1,300 g/mol or more; 1,350 g/mol or more; 1,400 g/mol or more; 1,450 g/mol or more; 1,500 g/mol or more; 1,650 g/mol or more; 1,700 g/mol or more; 1,750 g/mol or more; 1,800 g/mol or more; 1,850 g/mol or more; 1,900 g/mol or more; or 1,950 g/mol or more). The molecular weight of each branch of the branched prepolymer or telechelic prepolymer can range from any of the minimum values described above to any of the maximum values described above, for example from 650 g/mol to 2,000 g/mol (e.g., from 650 g/mol to 1,300 g/mol; from 1,300 g/mol to 2,000 g/mol; from 650 g/mol to 800 g/mol; from 8.00 g/mol to 1,000 g/mol; from 1,000 g/mol to 1,200 g/mol, from 1,200 g/mol to 1,400 g/mol, from 1,400 g/mol to 1,600 g/mol; from 1,600 g/mol to 1,800 g/mol; from 1,800 g/mol to 2,000 g/mol; or from 1,000 g/mol to 2,000 g/mol).

In some examples, the branched or telechelic prepolymer used herein can comprise a semi-crystalline polymer. Examples of semi-crystalline polymers include, but are not limited to, polyethylene, polyethylene terephthalate, polytetrafluoroethylene, isotactic polypropylene, polyphenylene sulfide, polyetherketone, polyetheretherketone, polyphthalamide, polyetherketoneketone, thermoplastic polyimide, polybutylene terephthalate, polyoxymethylene, nylon, polyesters, and poly(caprolactone). In some examples, the branched or telechelic prepolymer used herein can comprise a polymer that can undergo stress and/or strain induced crystallization. Examples of polymers that can undergo stress and/or strain induced crystallization include, but are not limited to, natural rubber, polyisoprene, poly(chloroprene), polyethylene glycol, poly(tetrahydrofuran), and poly(caprolactone). In some specific examples, the branched or telechelic prepolymer can comprise poly(caprolactone).

The branched or telechelic prepolymer has reactive groups that are available for bond formation; that is, the branched or telechelic prepolymer can be reacted when the reactive groups on separate branched or telechelic prepolymers or on the same branched or telechelic prepolymer form a bond with the reactive groups of the non-crystalline chain extender. Examples of reactive groups on a suitable branched or telechelic prepolymer include nucleophilic groups or electrophilic groups. Specific examples of nucleophilic reactive groups include thiols (sulfide), amines, azides, nitrites, alcohols (alkoxide), peroxides, carboxylic acids (carboxylate), thiocarboxylic acids (thiocarbonate), sulfonic acids (sulfoxide), and phosphonic acids (phosphates), where the deprotonated form of the reactive group is noted in parenthesis. Enolates can also be suitable nucleophilic reactive groups. In some examples, the branched or telechelic prepolymer has reactive groups, wherein the reactive groups can comprise hydroxyl groups.

Specific examples of electrophilic reactive groups can comprise ketones, aldehydes, alkenes, acyl halides, acrylates, carboxylic acids, esters, hemiacetal, acetals, hemiketal, ketal, orthoesters, amides, imines, imides, azo compounds, cyanates, isocyanate, thiocyanates, nitrates, nitriles, nitrites, thials, phosphines, and phosphodiesters. In some examples, the electrophilic reactive groups can comprise a Michael acceptor, which is an $\alpha,\beta$-unsaturated carbonyl, e.g., a (meth)acrylate group or allyl group. As used herein, the term "(meth)acrylate" indicates either "acrylate" or "methacrylate." In some examples, the electrophilic reactive groups can comprise isocyanates.

Other suitable reactive groups can be unsaturated moieties that can undergo a cycloaddition reaction, e.g., an alkene, alkyne, diene, nitrile, azide, carbonyl, imine, or hydroxamic acid.

As used herein a "non-crystalline" chain extender is a compound that is unable to crystallize in the same crystalline unit cell as the crystallizable segments of the branched or telechelic prepolymer. The non-crystalline chain extender has reactive groups that are available for bond formation; that is the non-crystalline chain extender can be reacted with the reactive groups of branched to telechelic prepolymer. Examples of reactive groups on a suitable non-crystalline chain extender include nucleophilic groups or electrophilic groups. The reactive groups of the non-crystalline chain extender can be complementary to the reactive groups of the branched or telechelic prepolymer. For example, if the reactive groups of the branched or telechelic prepolymer comprise electrophilic reactive groups the non-crystalline chain extender can comprise nucleophilic reactive groups.

In some examples, the non-crystalline chain extender can comprise 2 or more reactive groups (e.g., 3 or more, 4 or more, or 5 or more). In some examples the non-crystalline chain extender can comprise 6 or less reactive groups (e.g., 5 or less, 4 or less, or 3 or less). The number of reactive groups of the non-crystalline chain extender can range from any of the minimum values described above to any of the maximum values described above, for example from 2 to 6 (e.g., from 2 to 4, from 4 to 6, from 3 to 5, from 2 to 3, from 3 to 4, from 4 to 5, or from 5 to 6). In some examples, the non-crystalline chain extender can comprise a Michael donor. In some examples, the non-crystalline chain extender can comprise a multifunctional thiol. In some examples, the non-crystalline chain extender can comprise a polyisocyanate. In some examples, the non-crystalline chain extender can comprise a polyol.

In some examples, the molecular weight of the non-crystalline chain extender can be 50 g/mol or more (e.g., 60 g/mol or more; 70 g/mol or more; 80 g/mol or more; 90 g/mol or more; 100 g/mol or more; 150 g/mol or more; 200 g/mol or more; 250 g/mol or more; 300 g/mol or more; 350 g/mol or more; 400 g/mol or more; 450 g/mol or more; 500 g/mol or more; 650 g/mol or more; 700 g/mol or more; 750 g/mol or more; 800 g/mol or more; 850 g/mol or more; 900 g/mol or more; 1,000 g/mol or more; 1,050 g/mol or more; 1,100 g/mol or more; or 1,150 g/mol or more). In some examples, the molecular weight of the non-crystalline chain extender can be 1,200 g/mol or less (e.g., 1,150 g/mol or less; 1,100 g/mol or less; 1,050 g/mol or less; 1,000 g/mol or less; 950 g/mol or less; 900 g/mol or less; 850 g/mol or less; 800 g/mol or less; 750 g/mol or less; 700 g/mol or less; 650 g/mol or less; 600 g/mol or less; 550 g/mol or less; 500 g/mol or less; 450 g/mol or less; 400 g/mol or less; 350 g/mol or less; 300 g/mol or less; 250 g/mol or less; 200 g/mol or less; 150 g/mol or less; 100 g/mol or less; 90 g/mol or less; 80 g/mol or less; 70 g/mol or less; or 60 g/mol or less).

The molecular weight of the non-crystalline chain extender can range from any of the minimum values described above to any of the maximum values described above. For example, the molecular weight of the non-crystalline chain extender can be from 50 g/mol to 1,200 g/mol (e.g., from 50 g/mol to 600 g/mol; from 600 g/mol to 1,200 g/mol; from 50 g/mol to 200 g/mol; from 200 g/mol to 400 g/mol; from 400 g/mol to 600 g/mol; from 600 g/mol to 800 g/mol; from 800 g/mol to 1,000 g/mol; or from 1,000 g/mol to 1,200 g/mol).

In some examples, the molecular weight of the non-crystalline chain extender can be 20% or less of the molecular weight of the branched prepolymer or telechelic prepolymer (e.g., 19% or less, 18% or less, 17% or less, 16% or less, 15% or less, 14% or less, 13% or less, 12% or less, 11% or less, 10% or less, 9% or less, 8% or less, 7% or less, 6% or less, 5% or less, 4% or less, 3% or less, 2% or less, or 1% or less). In some examples, the molecular weight of the non-crystalline chain extender can be from 50 g/mol to 20% of the molecular weight of the branched prepolymer or telechelic prepolymer.

Reacting the branched or telechelic prepolymer with the non-crystalline chain extender can occur by any suitable reaction. The amount of reactive groups in the branched or telechelic prepolymer involved in reactions, can be controlled by selecting the desired amount of non-crystalline chain extender. That is, the stoichiometry of the reagents can be used to dictate the extent of the reaction. The amount of reaction can be monitored by various analytical techniques, such as TLC, IR spectroscopy, and NMR. Examples of suitable reactions include, but are not limited to, photocuring, condensation reactions, cycloaddition reactions, electrophilic additions, and nucleophilic additions (e.g., Michael additions). In some examples, reacting the branched or telechelic prepolymer with the non-crystalline chain extender can comprise a Michael addition. In some examples, the branched or telechelic prepolymer can comprise (meth)acrylate groups and reacting the branched or telechelic prepolymer can comprise base-catalyzed Michael addition of the (meth)acrylate groups of the branched or telechelic prepolymer and nucleophilic reactive groups (e.g., thiol, alcohol, or amine) of the non-crystalline chain extender. In some examples, the nucleophile is a multivalent nucleophile, which contains more than one nucleophile. A specific example, includes a multivalent thiol.

Reacting the branched to telechelic prepolymer with the non-crystalline chain extender can result in the formation of a composite prepolymer. The term "composite prepolymer" is used herein to refer to a compound, including a polymer that is functionalized at each end of the molecule and thus can enter into polymerization or other reactions through its functionalized, reactive end-groups. In some examples, the composite prepolymer has a low polydispersity. The composite prepolymer can refer to the product obtained when the prepolymer is reacted with the chain extender.

The composite prepolymer can, in some examples, have a molecular weight of 2,000 g/mol or more (e.g., 2,250 g/mol or more; 2,500 g/mol or more; 2,750 g/mol or more; 3,000 g/mol or more; 3,250 g/mol or more; 3,500 g/mol or more; 3,750 g/mol or more; 4,000 g/mol or more; 4,250 g/mol or more; 4,500 g/mol or more; 4,750 g/mol or more; 5,000 g/mol or more; 5,250 g/mol or more; 5,500 g/mol or more; 5,750 g/mol or more; 6,000 g/mol or more; 6,250 g/mol or more; 6,500 g/mol or more; 6,750 g/mol or more; 7,000 g/mol or more; 7,250 g/mol or more; 7,500 g/mol or more; or 7,750 g/mol or more). In some examples, the composite prepolymer can have a molecular weight of 8,000 g/mol or less (e.g., 7,750 g/mol or less; 7,500 g/mol or less; 7,250 g/mol or less; 7,000 g/mol or less; 6,750 g/mol or less; 6,500 g/mol or less; 6,250 g/mol or less; 6,000 g/mol or less; 5,750 g/mol or less; 5,500 g/mol or less; 5,250 g/mol or less; 5,000 g/mol or less; 4,750 g/mol or less; 4,500 g/mol or less; 4,250 g/mol or less; 4,000 g/mol or less; 3,750 g/mol or less; 3,500 g/mol or less; 3,250 g/mol or less; 3,000 g/mol or less; 2,750 g/mol or less; 2,500 g/mol or less; or 2,250 g/mol or less).

The molecular weight of the composite prepolymer can range from any of the minimum values described above to any of the maximum values described above. For example, the molecular weight of the composite prepolymer can be from 2,000 g/mol to 8,000 g/mol (e.g., from 2,000 g/mol to 5,000 g/mol; from 5,000 g/mol to 8,000 g/mol; from 2,000 g/mol to 3,000 g/mol; from 3,000 g/mol to 4,000 g/mol; from 4,000 g/mol to 5,000 g/mol; from 5,000 g/mol to 6,000 g/mol; from 6,000 g/mol to 7,000 g/mol; from 7,000 g/mol to 8,000 g/mol; or from 3,000 g/mol to 7,000 g/mol).

In some examples, the composite prepolymer can have a polydispersity index (PDI), of 1 or more (e.g., 1.1 or more, 1.2 or more, 1.3 or more, 1.4 or more, 1.5 or more, 1.6 or more, 1.7 or more, 1.8 or more, 1.9 or more, or 2.0 or more). In some examples, the composite prepolymer can have a PDI of 2.0 or less (e.g., 2.0 or less. 1.9 or less, 1.8 or less, 1.7 or less, 1.6 or less, 1.5 or less, 1.4 or less, 1.3 or less, 1.2 or less, 1.1 or less, or 1.05 or less). The PDI of the composite prepolymer can range from any of the minimum values described above to any of the maximum values described above. For example, the composite prepolymer can have a PDI from 1 to 2.0 (e.g., from 1.05 to 2.0, from 1.2 to 1.9, from 1 to 1.9, from 1.1 to 1.8 from 1.2 to 1.7, from 1.3 to 1.6, from 1.4 to 1.5, from 1.5 to 2.0, from 1.7 to 2.0, from 1 to 1.3, or from 1.1 to 1.4).

In some examples, the composite prepolymer can comprise 3 or more branches (e.g., 4 or more, 5 or more, 6 or more, 7 or more, 8 or more, or 9 or more). In some examples, the composite prepolymer can comprise 10 or less branches (e.g., 9 or less, 8 or less, 7 or less, 6 or less, 5 or less, or 4 or less). The number of branches in the composite prepolymer can range from any of the minimum values described above to any of the maximum values described above, for example from 3 to 10 (e.g., from 3 to 7, from 7 to 10, or from 4 to 9).

In some examples, each branch of the composite prepolymer is substantially the same molecular weight. In other words, in some examples within each composite prepolymer the branches have a low polydispersity.

The composite prepolymer has reactive groups that are available for bond formation; that is, the composite prepolymer can be reacted when the reactive groups on separate composite prepolymers or on the same composite prepolymer form a bond with the reactive groups of the multifunctional crosslinker. Examples of reactive groups on a suitable composite prepolymer include nucleophilic groups or electrophilic groups. In some examples, the composite prepolymer can comprise thiol end groups. In some examples, the composite prepolymer can comprise hydroxyl end groups (e.g., the composite prepolymer can comprise a polyol).

The multifunctional crosslinker has reactive groups that are available for bond formation; that is the multifunctional crosslinker can be crosslinked with the reactive groups of the composite prepolymer. Examples of reactive groups on a suitable multifunctional crosslinker include nucleophilic groups or electrophilic groups. The reactive groups of the multifunctional crosslinker can be complementary to the reactive groups of the composite prepolymer. For example, if the reactive groups of the composite prepolymer comprise nucleophilic reactive groups the multifunctional crosslinker can comprise electrophilic reactive groups.

In some examples, the multifunctional crosslinker can comprise 2 or more reactive groups (e.g., 3 or more, 4 or more, or 5 or more). In some examples the multifunctional crosslinker can comprise 6 or less reactive groups (e.g., 5 or less, 4 or less, or 3 or less). The number of reactive groups of the multifunctional crosslinker can range from any of the minimum values described above to any of the maximum values described above, for example from 2 to 6 (e.g., from 2 to 4, from 4 to 6, from 3 to 5, from 2 to 3, from 3 to 4, from 4 to 5, or from 5 to 6). In some examples, the multifunctional crosslinker can comprise a Michael acceptor. In some examples, the multifunctional crosslinker can comprise a multifunctional (meth)acrylate or a multifunctional allylate. In some examples, the multifunctional crosslinker can comprise a polyisocyanate.

Crosslinking the composite prepolymer can occur by any suitable crosslinking reaction. The amount of crosslinking, and thus the amount of reactive groups in the composite prepolymer involved in reactions, can be controlled by selecting the desired amount of multifunctional crosslinker. That is, the stoichiometry of the reagents can be used to dictate the extent of crosslinking. The amount of crosslinking can be monitored by various analytical techniques, such as TLC, IR spectroscopy, and NMR.

Examples of crosslinking reactions include, but are not limited to, photocuring, free radical polymerization, cationic polymerization, anionic polymerization, coordination polymerization, ring-opening polymerization, chain-growth polymerization, chain transfer polymerization, emulsion polymerization, ionic polymerization, solution polymerization, step-growth polymerization, suspension polymerization, radical polymerization, condensation reactions, cycloaddition reactions, electrophilic additions, and nucleophilic additions (e.g., Michael additions). In some examples, crosslinking the composite prepolymer can comprise a Michael addition. In some examples, the composite prepolymer can comprise thiol groups and crosslinking the composite prepolymer can comprise base-catalyzed Michael addition of the thiol groups of the composite prepolymer and electrophilic reactive groups (e.g., a Michael acceptor) of the multifunctional crosslinker. In some examples, crosslinking the composite prepolymer with the multifunctional crosslinker can comprise a crosslinking reaction between a polyol and a polyisocyanate, such that the shape memory polymer can include urethane linkages.

In some examples, the effective molecular weight between crosslinks of the shape-memory polymer can be 1,000 g/mol or more (e.g., 1,500 g/mol or more; 2,000 g/mol or more; 2,500 g/mol or more; 3,000 g/mol or more; 3,500 g/mol or more; 4,000 g/mol or more; 4,500 g/mol or more; 5,000 g/mol or more; 5,500 g/mol or more; 6,000 g/mol or more; 6,500 g/mol or more; 7,000 g/mol or more; 7,500 g/mol or more; 8,000 g/mol or more; 8,500 g/mol or more; 9,000 g/mol or more; or 9,500 g/mol or more). In some examples, the effective molecular weight between crosslinks of the shape-memory polymer can be 10,000 g/mol or less (e.g., 9,500 g/mol or less; 9,000 g/mol or less; 8,500 g/mol or less; 8,000 g/mol or less; 7,500 g/mol or less; 7,000 g/mol or less; 6,500 g/mol or less; 6,000 g/mol or less; 5,500 g/mol or less; 5,000 g/mol or less; 4,500 g/mol or less; 4,000 g/mol or less; 3,500 g/mol or less; 3,000 g/mol or less; 2,500 g/mol or less; 2,000 g/mol or less; or 1,500 g/mol or less).

The effective molecular weight between crosslinks of the shape-memory polymer can range from any of the minimum values described above to any of the maximum values described above. For example, the effective weight between crosslinks of the shape-memory polymer can be from 1,000 g/mol to 10,000 g/mol (e.g., from 1,000 g/mol to 5,500 g/mol; from 5,500 g/mol to 10,000 g/mol; from 1,000 g/mol to 2,500 g/mol; from 2,500 g/mol to 4,000 g/mol; from 4,000 g/mol to 5,500 g/mol; from 5,500 g/mol to 7,000 g/mol; from 7,000 g/mol to 8,500 g/mol; from 8,500 g/mol to 10,000 g/mol; or from 2,000 g/mol to 9,000 g/mol).

In some examples, the crosslinking reaction can be performed in the presence of a free radical scavenger. Examples of suitable free radical scavengers include 2,2',6,6'-tetramethyl-1-piperinyloxy, free radical (TEMPO); 4-amino-2,2', 6,6'-tetramethyl-1-piperinyloxy, free radical (4-amino-TEMPO); 4-hydroxy-2,2',6,6'-tetramethyl-piperidene-1-oxy, free radical (TEMPOL), 2,2',3,4,5,5'-hexamethyl-3-imidazolinium-1-yloxy methyl sulfate, free radical; 16-doxyl-stearic acid, free radical; superoxide dismutase mimic (SODm), ascorbic acid, glutathione, tocopherols, and tocotrienols. Residues and byproducts of these scavengers can also be present in the disclosed shape-memory polymers.

After the crosslinking, the resulting shape-memory polymer can be purified and/or isolated.

In some examples, the shape-memory polymers described herein can store elastic energy. In some examples, the shape-memory polymer can have an elastic energy density of 1 megajoules per cubic meter ($MJ/m^3$) or more (e.g., 1.1 $MJ/m^3$ or more, 1.2 $MJ/m^3$ or more, 1.3 $MJ/m^3$ or more, 1.4 $MJ/m^3$ or more, 1.5 $MJ/m^3$ or more, 1.6 $MJ/m^3$ or more, 1.7 $MJ/m^3$ or more, 1.8 $MJ/m^3$ or more, 1.9 $MJ/m^3$ or more, 2.0 $MJ/m^3$ or more, 2.1 $MJ/m^3$ or more, 2.2 $MJ/m^3$ or more, 2.3 $MJ/m^3$ or more, 2.4 $MJ/m^3$ or more, 2.5 $MJ/m^3$ or more, 2.6 $MJ/m^3$ or more, 2.7 $MJ/m^3$ or more, 2.8 $MJ/m^3$ or more, or 2.9 $MJ/m^3$ or more). In some examples, the shape-memory polymers can have an elastic energy density of 3 $MJ/m^3$ or less (e.g., 2.9 $MJ/m^3$ or less, 2.8 $MJ/m^3$ or less, 2.7 $MJ/m^3$ or less, 2.6 $MJ/m^3$ or less, 2.5 $MJ/m^3$ or less, 2.4 $MJ/m^3$ or less, 2.3 $MJ/m^3$ or less, 2.2 $MJ/m^3$ or less, 2.1 $MJ/m^3$ or less, 2.0 $MJ/m^3$ or less, 1.9 $MJ/m^3$ or less, 1.8 $MJ/m^3$ or less, 1.7 $MJ/m^3$ or less, 1.6 $MJ/m^3$ or less, 1.5 $MJ/m^3$ or less, 1.4 $MJ/m^3$ or less, 1.3 $MJ/m^3$ or less, 1.2 $MJ/m^3$ or less, or 1.1 $MJ/m^3$ or less). The elastic energy density of the shape-memory polymer can range from any of the minim values described above to any of the maximum values described above, for example from 1 $MJ/m^3$ to 3 $MJ/m^3$ (e.g., from 1 $MJ/m^3$ to 2 $MJ/m^3$, from 2 $MJ/m^3$ 3 $MJ/m^3$, from 1 $MJ/m^3$ to 1.5 $MJ/m^3$, from 1.5 $MJ/m^3$ to 2 $MJ/m^3$, from 2.5 $MJ/m^3$ to 3 $MJ/m^3$, or from 1.5 $MJ/m^3$ to 1.5 $MJ/m^3$).

The stored elastic energy can be determined by (i) stretching a rectangular specimen to a specified relative strain (400% is used herein); (ii) releasing the applied load and measuring the resulting fixed strain; (iii) heating the sample while held at a constant strain to generate a tensile stress; and (iv) recording sample strain while slowly reducing stress, or recording stress while slowly decreasing the strain. The data from step (iv) of the above (in stress-strain space) can be integrated and divided by sample volume to determine the energy storage per volume of sample.

In some examples, the shape-memory polymer can have an energy storage efficiency (which is the energy in during the room temperature strain process compared to energy out when the sample is heated above its transition temperature and slowly recovered during shape recovery) of 50% or more (e.g., 50% or more, 55% or more, 60% or more, 65% or more, 70% or more, 75% or more, 80% or more, 85% or more, 90% or more, 95% or more, or 99% or more). In some examples, the shape-memory polymer can have an energy storage efficiency of 100% or less (e.g., 99% or less, 95% or less, 90% or less, 85% or less, 80% or less, 75% or less, 70% or less, 65% or less, 60% or less, or 55% or less). The energy storage efficiency of the shape-memory polymer can range from any of the minimum values described above to any of the maximum values described above, for example from 50% to 100% (e.g., from 55% to 90%, from 60 to 100%, from 70 to 100%, from 80 to 100%, from 90% to 100%, from 70% to 85%, from 85% to 95%, from 90% to 95%, from 95% to 100%, or from 65% to 95%).

It is noted that the energy storage efficiencies found in the disclosed compositions are significantly higher than that observed in other shape-memory polymers. Other materials have efficiency values of around 20%. While not wishing to be bound by theory, the disclosed materials are believed to have so much higher energy storage efficiencies because they are easily cold-drawn due to the little amount of crystallinity near room temperature. The more crystallinity that is present, the more difficult it is to cold-draw, and the lower the efficiency.

In some examples, the shape-memory polymer can have a strength of 1 megapascals (MPa) or more (e.g., 1.5 MPa or more, 2 MPa or more, 2.5 MPa or more, 3 MPa or more, 3.5 MPa or more, 4 MPa or more, 4.5 MPa or more, 5 MPa or more, 5.5 MPa or more, 6 MPa or more, 6.5 MPa or more, 7 MPa or more, 7.5 MPa or more, 8 MPa or more, 8.5 MPa or more, 9 MPa or more, or 9.5 MPa or more). In some examples, the shape-memory polymer can have a strength of 10 MPa or less (e.g., 9.5 MPa or less, 9 MPa or less, 8.5 MPa or less, 8 MPa or less, 7.5 MPa or less, 7 MPa or less, 6.5 MPa or less, 6 MPa or less, 5.5 MPa or less, 5 MPa or less, 4.5 MPa or less, 4 MPa or less, 3.5 MPa or less, 3 MPa or less, 2.5 MPa or less, 2 MPa or less, or 1.5 MPa or less). The strength of the shape-memory polymer can range from any of the minimum values described above to any of the maximum values described above, for example from 1 MPa to 10 MPa (e.g., from 1 MPa to 5 MPa, from 5 MPa to 10 MPa, from 1 MPa to 2.5 MPa, from 2.5 MPa to 5 MPa, from 5 MPa to 7.5 MPa, from 7.5 MPa to 10 MPa, from 2 MPa to 9 MPa, or from 2 MPa to 3 MPa).

In some examples, the shape-memory polymer can have a strain fixity of 65% or more (e.g., 70% or more, 75% or more, 80% or more, 85% or more, 90% or more, or 95% or more). In some examples, the shape-memory polymer can have a strain fixity of 100% or less (e.g., 95% or less, 90% or less, 85% or less, 80% or less, 75% or less, or 70% or less). The strain fixity of the shape-memory polymer can range from any of the minimum values described above to any of the maximum values described above, for example from 65% to 100% (e.g., from 65% to 80%, from 80% to 100%, from 65% to 75%, from 75% to 85%, or from 85% to 100%).

In some examples, the shape-memory polymer can have a stress free or unconstrained shape recovery ratio of 0.9 or more (e.g., 0.91 or more, 0.92 or more, 0.93 or more, 0.94 or more, 0.95 or more, 0.96 or more, 0.97 or more, 0.98 or more, or 0.99 or more). In some examples, the shape-memory polymer can have a stress free or unconstrained shape recovery ratio of 1.0 or less (e.g., 0.99 or less, 0.98 or less, 0.97 or less, 0.96 or less, 0.95 or less, 0.94 or less, 0.93 or less, 0.92 or less, or 0.91 or less). The stress free or unconstrained shape recovery ratio of the shape-memory polymer can range from any of the minimum values described above to any of the maximum values described above, for example from 0.9 to 1.0 (e.g., from 0.9 to 0.95, from 0.95 to 1.0, from 0.9 to 0.93, from 0.93 to 0.96, or from 0.96 to 1.0).

Also disclosed herein are methods of making shape-memory polymers. The disclosed methods can comprise, for example, reacting a branched or telechelic prepolymer having a low polydispersity with a non-crystalline chain extender to form a composite prepolymer, and crosslinking a stoichiometric amount of a multifunctional crosslinker with the composite prepolymer, thereby forming the shape-memory polymer.

In some examples, the method can further comprise stretching the shape-memory polymer. Stretching the shape-memory polymer can be accomplished by standard techniques. In some examples, stretching the shape-memory polymer can comprise applying a stretching load.

When stretching the shape-memory polymer, the rate at which the polymer is stretched can influence the crystallinity. Stretching reforms a fraction of crystals into more stable configurations, which melt at higher temperatures. In general, the slower the stretching, the more crystals form and the higher the melting point. Faster stretching generally results in less crystals and lower melting. Thus, by varying the stretch rate, one can control the crystallinity and melting point of the polymer. Stretch rates that can be used full herein can be from 1 mm/min to about 120 mm/min. For example, the stretch rate can be 1, 5, 10, 15, 20, 25, 30, 35, 40, 45, 50, 55, 60, 65, 70, 75, 80, 85, 90, 95, 100, 105, 110, 115, or 120 mm/min, where any of the stated values can form an upper or lower endpoint of a range. In more examples, the stretch rate can be from 1 to about 10 mm/min, from 10 to 50 mm/min, from 50 to 100 mm/min, from 1 to 50 mm/min, or from 20 to 70 mm/min.

Another parameter that can affect the crystallinity of the shape-memory polymers is the period of time the polymer is held in its stretched state (i.e., the hold time). Generally holding samples in their stretched state for longer periods of time can lead to more stable crystals. Hold times that can be useful herein include from 0 min to 15 min. For examples, the hold time can be 0, 1, 2, 3, 4, 5, 6, 7, 8, 9, 10, 11, 12, 13, 14, or 15, where any of the stated values can form an upper or lower endpoint of a range. Longer hold times are also possible, for example, 1 min or more, 5 min or more, 10 min or more, or 20 min or more.

The shape-memory polymer can have an unstretched length and a post-stretched length. The post-stretched length can be greater than the unstretched length. The shape-memory polymer can be stretched to any point up to the breaking point, meaning the post-stretched length can be longer than the unstretched length by any amount, up to the length where the shape-memory polymer breaks.

In some examples, the post-stretched length can be longer than the unstretched length, for example, by 100% or more (e.g., 150% or more, 200% or more, 250% or more, 300% or more, 350% or more, 400% or more, 450% or more, 500% or more, or 550% or more). In some examples, the post-stretched length can be longer than the unstretched length by 600% or less (e.g., 550% or less, 500% or less, 450% or less, 400% or less, 350% or less, 300% or less, 250% or less, 200% or less, or 150% or less). The amount that the post-stretched length is longer than the unstretched length can range from any of the minimum values described above to any of the maximum values described above, for example from 100% to 600% (e.g., from 100% to 450%, from 450% to 600%, from 100% to 200%, from 200% to 300%, from 300% to 400%, from 400% to 500%, from 500% to 600%, from 150% to 550%, or from 200% to 500%).

In some examples, the method can further comprise heating the shape-memory polymer while the shape-memory polymer is maintained at the post-stretched length. In some examples, the method can further comprise removing the stretching load from the shape-memory polymer.

In some examples, the unstretched shape memory polymer can have a stress free or unstained melting temperature of 35° C. or more as measured by differential scanning calorimetry (DSC) (e.g., 36° C. or more, 37° C. or more, 38° C. or more, 39° C. or more, 40° C. or more, 41° C. or more, 42° C. or more, 43° C. or more, 44° C. or more, 45° C. or more, 46° C. or more, 47° C. or more, 48° C. or more, or 49° C. or more). In some examples, the unstretched shape memory polymer can have a stress free or unstained melting temperature of 50° C. or less as measured by DSC (e.g., 49° C. or less, 48° C. or less, 47° C. or less, 46° C. or less, 45° C. or less, 44° C. or less, 43° C. or less, 42° C. or less, 41° C. or less, 40° C. or less, 39° C. or less, 38° C. or less, 37° C. or less, or 36° C. or less).

The stress free or unstained melting temperature of the unstretched shape memory polymer can range from any of the minimum values described above to any of the maximum values described above. For example, the unstretched shape memory polymer can have a stress free or unstained melting temperature of from 35° C. to 50° C. as measured by DSC (e.g., from 35° C. to 42° C., from 42° C. to 50° C., from 35° C. to 40° C., from 40° C. to 45° C., from 45° C. to 50° C., or from 37° C. to 48° C.).

In some examples, the stretched shape-memory polymer can be triggered by body temperature (e.g., normal human body temperature) to return to the unstretched state if unconstrained or to develop stress if constrained. In some examples, the stretched shape-memory polymer can have a melting temperature of 40° C. or less (e.g., 39° C. or less, 38° C. or less, 37° C. or less, 36° C. or less, 35° C. or less, 34° C. or less, 33° C. or less, 32° C. or less, 31° C. or less, 30° C. or less, 29° C. or less, 28° C. or less, 27° C. or less, or 26° C. or less) as measured by differential scanning calorimetry. In some examples, the stretched shape-memory polymer can have a melting temperature of 25° C. or more (e.g., 26° C. or more, 27° C. or more, 28° C. or more, 29° C. or more, 30° C. or more, 31° C. or more, 32° C. or more, 33° C. or more, 34° C. or more, 35° C. or more, 36° C. or more, 37° C. or more, 38° C. or more, or 39° C. or more). The melting temperature of the stretched shape-memory polymer can range from any of the minimum values described above to any of the maximum values described above, for example from 25° C. to 40° C. (e.g., from 25° C. to 32° C., from 32° C. to 40° C., from 25° C. to 30° C., from 30° C. to 35° C., from 35° C. to 40° C., or from 27° C. to 38° C.).

Also disclosed herein are methods of use of the shape-memory polymers disclosed herein. For example, the shape-memory polymers can comprise body-temperature triggered shape-memory polymers. In some examples, the body-temperature triggered shape-memory polymers can be used with a fabric, for example for compressive clothing, compressive bandages, etc. Other examples of uses for the body-temperature triggered shape-memory polymers include, for example, tourniquets, sutures, artificial skin, medical dispensers, consumable dispensers, toys, footwear, personal protective equipment (PPE), and the like.

The examples below are intended to further illustrate certain aspects of the methods and compounds described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Crystallization was frustrated in semicrystalline polymer network chains to create shape-memory programming near room temperature and shape-memory triggering near body temperature. The prepared material involved a well-defined amorphous, homogeneous network that was formed by reacting multi-arm (e.g. three arm) semicrystalline prepolymers with small molecule linkers. The linker reagents were chosen to make the otherwise crystallizable system frustrated. The resulting frustrated network has little crystallinity at room temperature, but it can be fixed into a temporary shape upon strain-induced crystallization. The strain-induced crystallites were melted upon heating to temperature around body temperature (~35° C.), returning to the amorphous (crystalline-free) permanent shape while releasing stored elastic energy.

This system is different from PEU materials because it contains only one phase that is predominately a semicrystalline polymer, and therefore the material is capable of storing a large amount of elastic energy. Also, by avoiding crystals at room temperature (such as those present in PEUs or other PCL materials), the material remains soft and can be easily stretched and fixed. In contrast, cold-drawing a material like PEU that is semicrystalline at room temperature requires large stresses that reorient and disintegrate crystals before they can be reformed (Xue L et al. *Macromolecules*, 2009, 42(4), 964-972; Kamal T et al. *Macromolecules*, 2012, 45(21), 8752-8759). Using a material that is amorphous at room temperature obviates this need. Moreover, the lack of crystallinity at room temperature enables a high level of stress to be realized when triggered under a mechanical constraint, because stress should decay when crystals form.

In contrast to prior studies involving natural rubber, the protocol discussed herein works for different semicrystalline polymer species and permits the generation of large stresses (a few MPa's) or the performance of large amounts of mechanical work (a few MJ/m$^3$) even when the SMP is programmed at fairly low strains (<300%). The prior studies involving natural rubber were species dependent, and required both high strains (1000%) and high strain rates to achieve comparable elastic strength. Lastly, the methods discussed herein can permit tunability of the transition temperatures, based on appropriate selection of commercially available prepolymers and linkers. Unlike the previous studies for natural rubber, the compositions and methods described herein do not rely on draw rate or draw temperature to affect the trigger temperature.

A class of rubberlike network polymers, capable of crystallizing when stretched and temporarily held near room temperature, thereby fixing the material into a temporary deformed shape, were investigated. These materials were found to be capable of storing a large amount of deformation (~300% strain) following the shape-fixing step. Once fixed, these materials were triggered to return to their permanent shape by heating to an elevated temperature near the human body temperature (~35° C.). If triggered by heating to an elevated temperature near the human body temperature while under a mechanical constraint, the materials generated a non-decaying stress. This behavior makes these shape-memory polymers of interest for a variety of applications, for example in biotechnology and medical devices where a thermally-induced stress accumulation or attainment of physical work is desired. Examples may include bandages for compression, tourniquets, sutures, artificial skin, body-heat assisted medical or consumable dispensers, and so on.

These shape-memory polymers were programmed near room temperature and triggered near body temperature (e.g., possibly using body heat) once programmed. These materials were mostly amorphous (non-crystalline) and homogeneous near room temperature. The soft, room temperature state makes the materials easy to deform, leading to strain-induced crystallization. Polymers that undergo strain-induced crystallization can simplify the shape programming step of a shape-memory cycle. The formed crystals can fix the materials into a temporary shape. Hence, these material were stretched and fixed in a single step that used a small amount of mechanical energy. Once programmed, the formed crystals melted between room temperature (~25° C.) and a temperature near body temperature (~35° C.). If melted without a constraint, shape recovery occurred, and the materials reverted to their original shape. If trigged with a mechanical load or a constraint present, a stress developed that did not decay at room temperature over a long period of time. As such, these materials can be used to apply stress for a use period needed for a specific application. The thermomechanical cycles involving deformation and shape fixing, followed by shape recovery or stress generation can be repeated multiple times (>10 times) without any observable performance compromise.

The effect of molecular architecture on the cold-drawability and shape-memory properties of the frustrated PCL-based covalent networks was investigated. The synthesis of shape-memory networks capable of storing elastic energy by converting the end-groups of low polydispersity poly(ε-caprolactone) (PCL) chains with multifunctional thiols, followed by base-catalyzed Michael addition of multifunctional acrylates or multifunctional allylates with the low polydispersity, thiol-terminated PCL chains was investigated. Three-armed PCLs containing acrylate end-groups were synthesized and reacted with non-crystalline spacer molecules, namely multifunctional thiols. The three-armed PCL chains containing the non-crystalline space molecules and thiol end groups were then crosslinked, fixing the molecular weights between crosslinks. Network formation was accomplished with the selective and efficient Michael Addition reaction.

The thiol-acrylate or thiol-allylate Michael Addition reaction can be controlled such that the molecular weight between crosslinks can be substantially the same as that of polymer precursor branches. Further, the chemistry is compatible with polymer melt processing, including injection molding, and the material can be formed into different shapes. The resulting elastomers exhibited a degree of crystallinity and shape-memory properties. Elastomers were cold-drawn to achieve several hundred percent of temporary strain, and, upon heating, shape recovery was observed.

Figure 2:
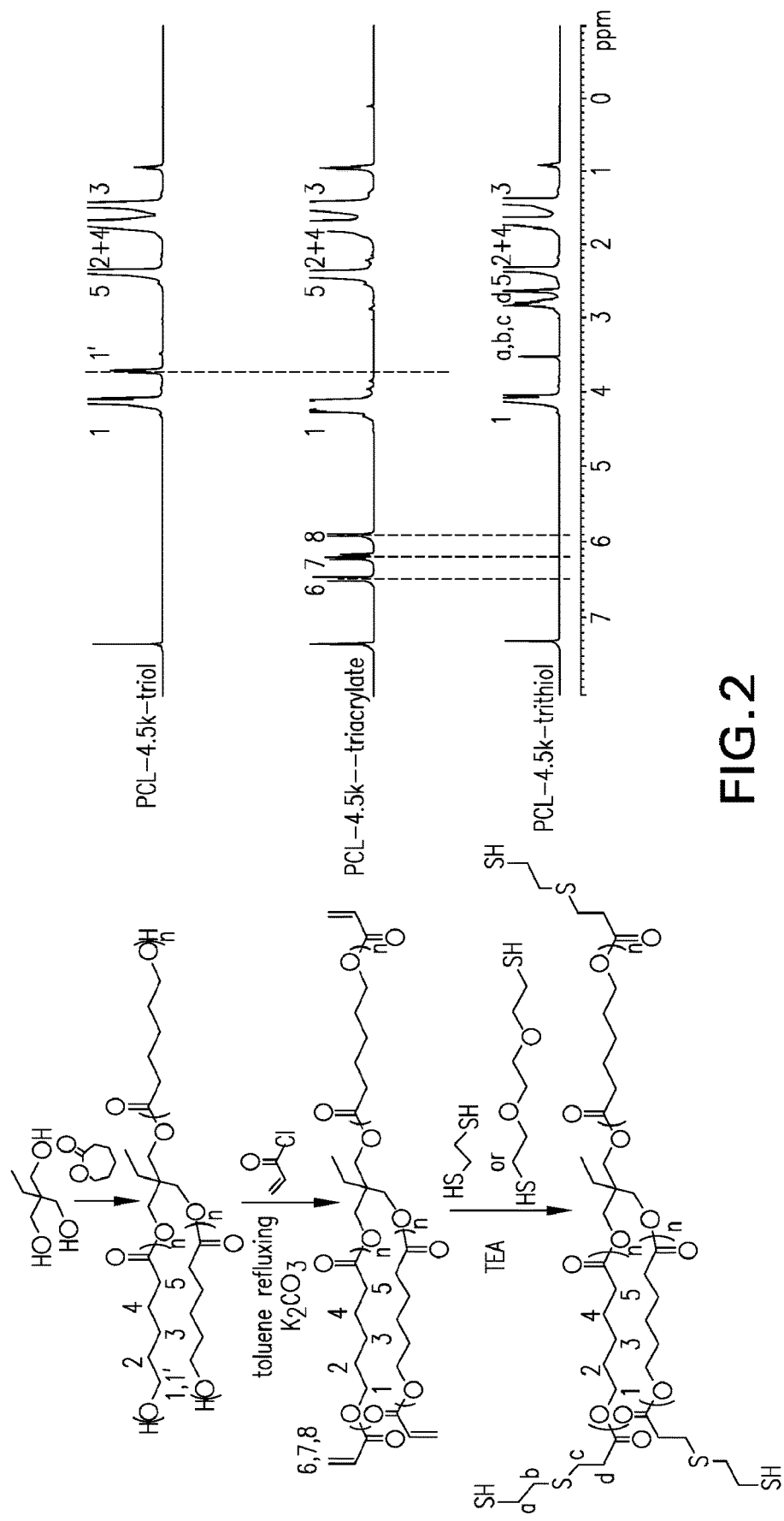
FIG. 2 displays the NMR end-group analysis of the conversion from the PCL-triol to the PCL-triacrylate to the PCL-trithiol.
Figure 3:
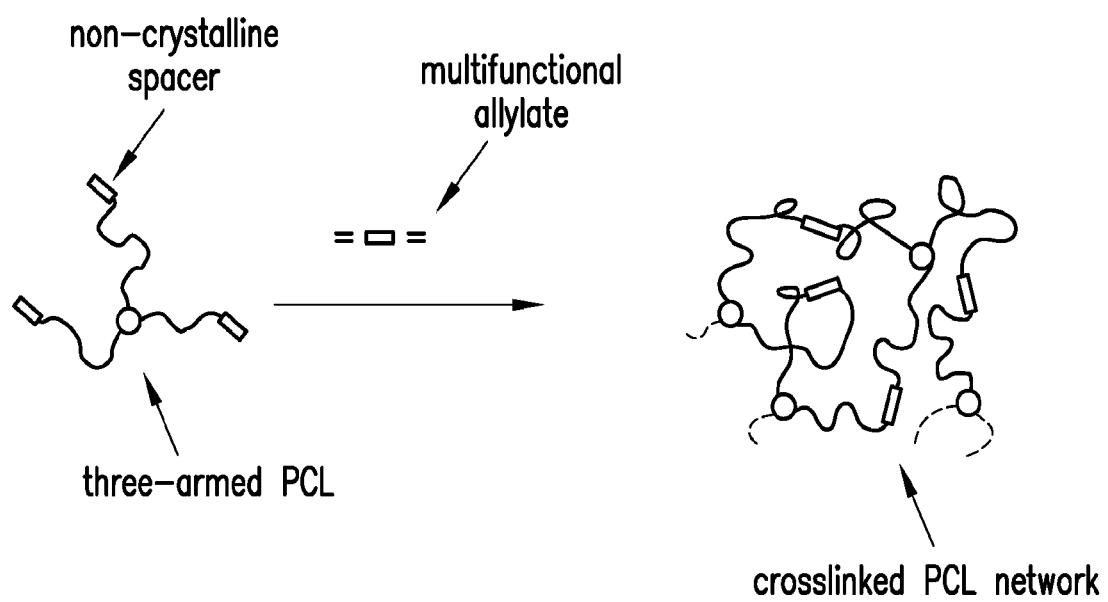
FIG. 3 displays a general crosslinking reaction of the PCL-trithiol with a multifunctional allylate to form the crosslinked PCL network.

A hydroxyl-terminated, three-arm poly(caprolactone) prepolymer was synthesized by ring-opening polymerization of caprolactone using glycerol as a tri-functional seed (Krichel-dorf H R and Hachmann-Thiessen H. *Macromol Chem Phys* 2005, 206(7), 758-766). The resultant polymer (PCL-triol) was purified, and the molecular weight of the obtained prepolymer was determined to be 4,500 g/mol (NMR end-group analysis) (FIG. 1). The hydroxy-terminated prepolymer was acrylated by nucleophilic substitution with acryloyl chloride to form a three-arm prepolymer (FIG. 1). The NMR analysis of the PCL-triacrylate product (PCL-prepolymer) suggested a molecular weight of 6,200 g/mol and complete end-group conversion. The PCL-triacrylate was mixed with an excess of a non-crystalline spacer molecule comprising a multifunctional thiol to form a PCL-trithiol (FIG. 1). The NMR end group analysis for the conversion of the PCL-triol to the PCL-triacrylate to the PCL-trithiol is shown in FIG. 2. At 60° C., a stoichiometrically balanced mixture was formulated with PCL-trithiol, a multifunctional allylate crosslinker, a base, and a radical scavenger (FIG. 3). The mixture was degassed and allowed to cure for 48 hours.

The molecular weight of the PCL prepolymer is related to the crosslink density in the final SMP. In general, a lower molecular weight of the PCL prepolymer is related to shorter chain lengths in each of the arms and a higher crosslink density in the final SMP (relative to a higher molecular weight PCL prepolymer). A higher crosslink density in turn can result in a stronger material with better recovery.

Figure 4:
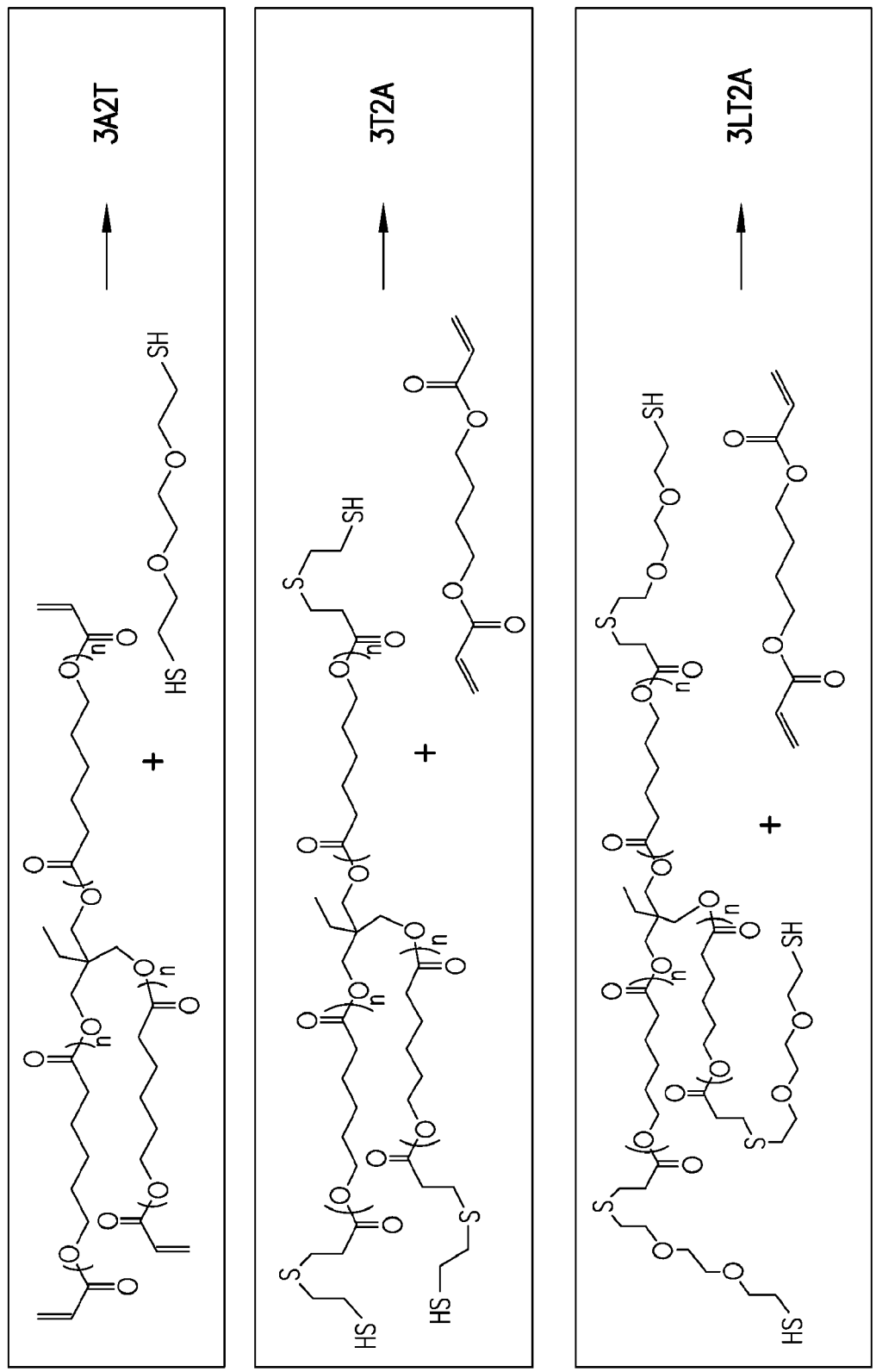
FIG. 4 displays chemical schemes of the formation of three different PCL networks.

A series of PCL networks was synthesized using the same PCL prepolymer (MW-4,500 g/mol) with different non-crystalline spacer lengths. Three networks containing non-crystalline spacers were formed according to FIG. 4; from shortest to longest: 3A2T, 3T2A, 3LT2A refer to a triacrylate reacted with a dithiol, a trithiol reacted with a diacrylate, and a trithiol with a longer non-crystalline spacer reacted with a diacrylate, respectively.

Figure 5:
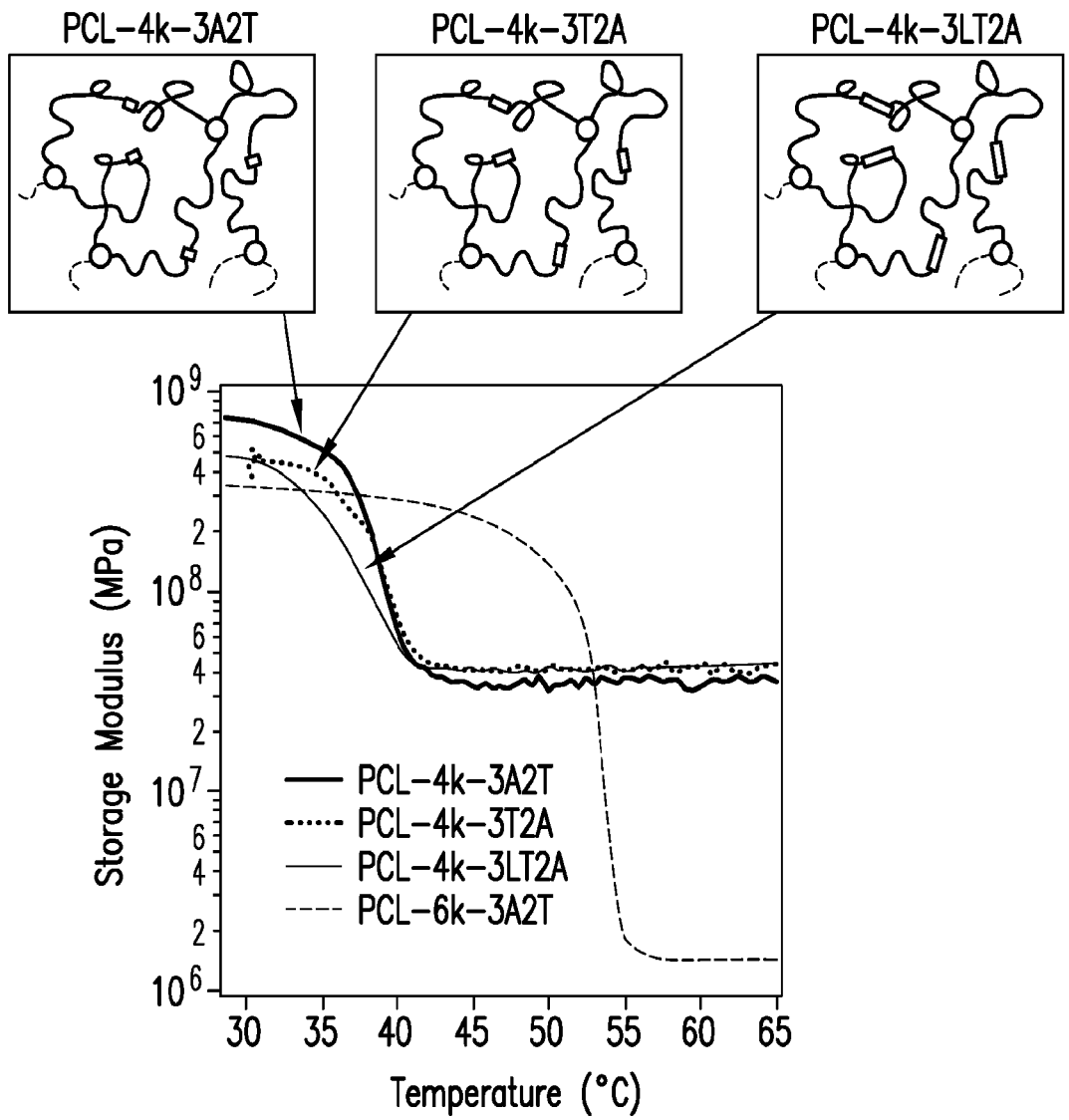
FIG. 5 displays the storage modulus of the PCL networks from dynamic mechanical analysis versus temperature.

Dynamic Mechanical Analysis (DMA) temperature ramp experiments were performed over the temperature range 25-65° C. using a Rheometrics RSAII solids analyzer. Data were analyzed using the commercially available TA Orchestrator software program. FIG. 5 shows that all networks formed from the PCL prepolymer having a molecular weight around 4,500 g/mol (denoted PCL-4k in the legend) become softer at temperatures between 35° C. and 40° C. (e.g., around body temperature). For comparison, a network formed from a PCL prepolymer having a molecular weight around 6,000 g/mol (denoted PCL-6k in the legend) is also shown. This higher molecular weight network shows a larger change in storage modulus upon melting, and has a higher transition temperature (~55° C.).

Figure 6:
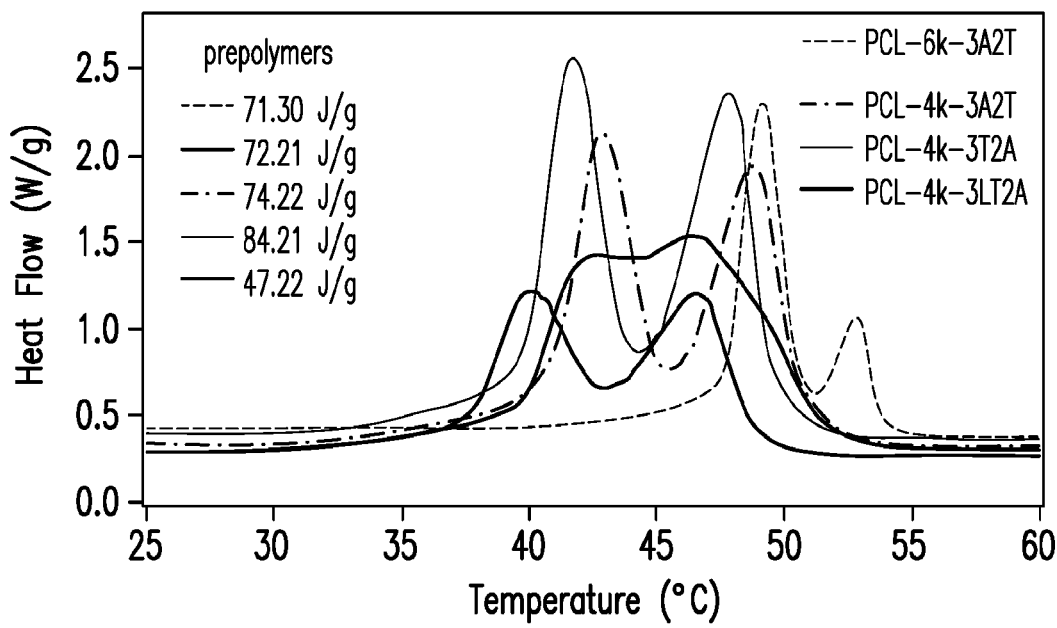
FIG. 6 displays the DSC scans of the PCL prepolymers reacted with a series of non-crystalline spacers.
Figure 7:
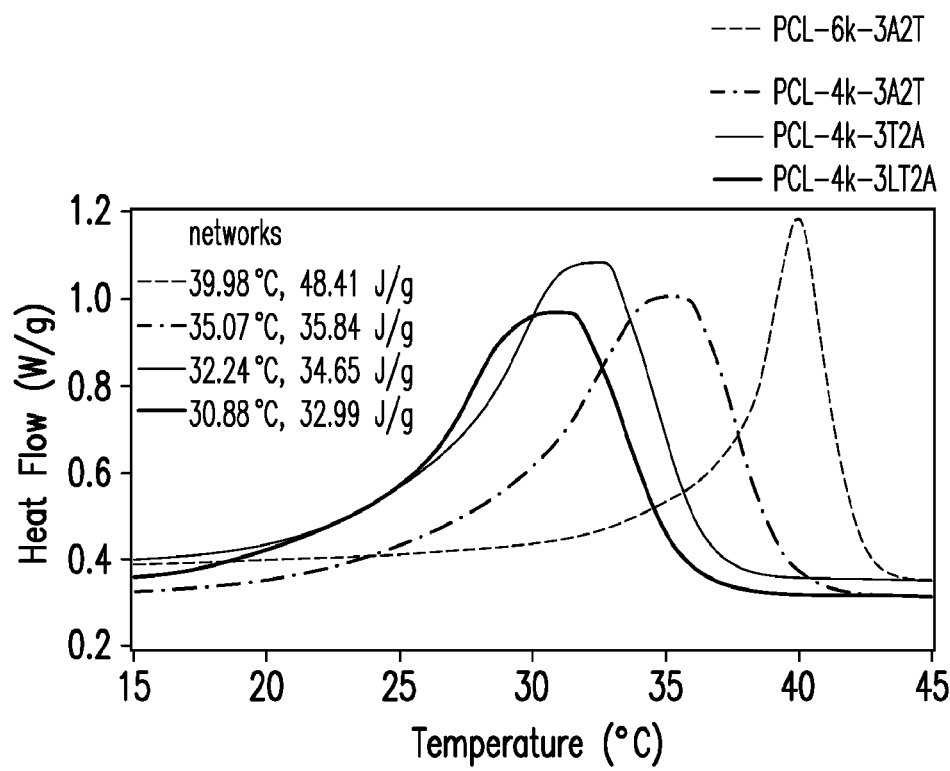
FIG. 7 displays the DSC scans of the series of crosslinked PCL networks.

Differential scanning calorimetry was performed using a TA Instruments, Q2000 DSC. DSC analysis of the PCL prepolymers after reaction with the various spacers is shown in FIG. 6. The corresponding DSC analysis of the series after crosslinking is shown in FIG. 7. The DSC results for the crosslinked PCL networks indicate that the transition temperatures for the networks based on the PCL prepolymer having a molecular weight of ~4,500 g/mol are ~31° C., 32° C. and ~35° C. for the 3A2T, 3T2A, and 3LT2A non-crystalline spacers, respectively. The DSC results indicate that the length of the non-crystalline spacer can be systematically varied to affect the transition temperatures of the PCL prepolymers and the crosslinked PCL networks.

Mechanistically, cold-drawing a PCL-rich material just beneath its melting point can reorient and disrupt small crystallites and can substantially stretch network strands, removing configurational entropy (Kamal T et al. *Macromolecules* 2012, 45(21), 8752-8759). The amount of entropy lost upon forming a crystal ($\Delta S_m$) can be lessened, causing an increase in the melting point, $T_m = \Delta H_m / \Delta S_m$ and, consequently, new crystals can form.

Figure 8:
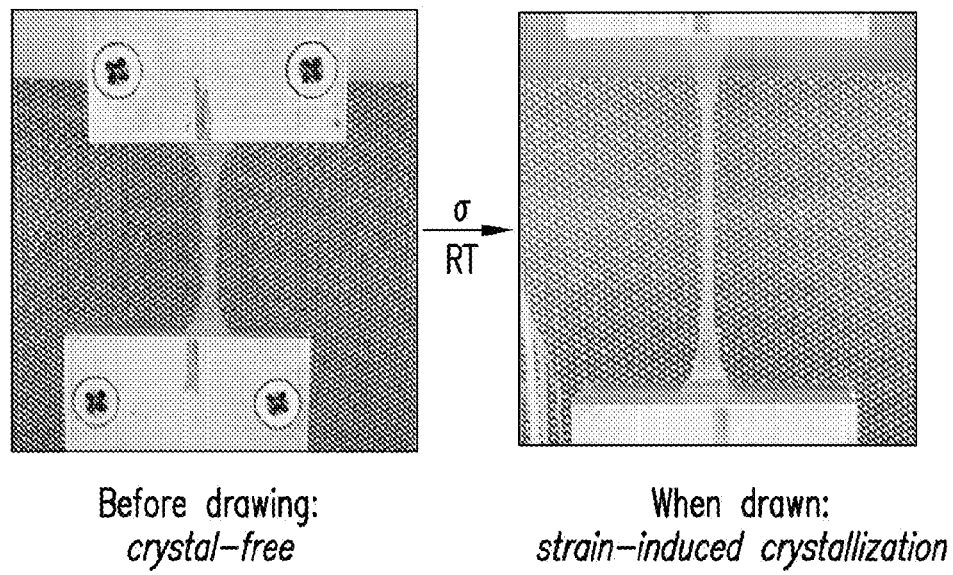
FIG. 8 displays photographs of a sample before and after cold-drawing.
Figure 9:
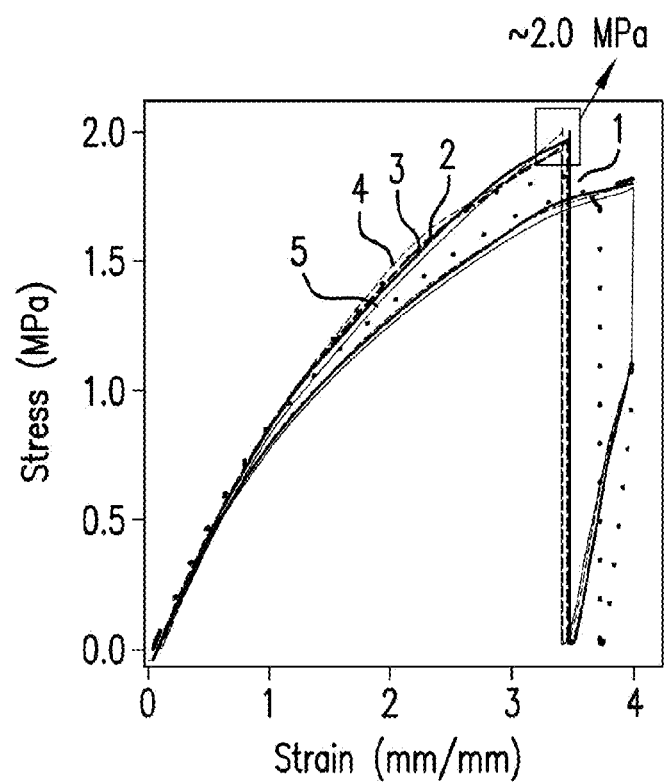
FIG. 9 displays plots of stress versus strain for several shape memory cycles of a sample; the annotation indicates the cycle number.

PCL-4k-3T2A, with its well defined network formed by Michael addition, exhibited shape memory properties. Cold-drawing of the PCL-4k-3T2A sample in an MTS tensile testing apparatus (Q Test/5) at room temperature is shown in FIG. 8. Slow-unload shape-memory cycles were performed to assess the capacity of the fixed shape to store elastic energy (FIG. 9). Samples were strained at 15 mm/min to 400% of the gauge length and held for five minutes. After thirty seconds, the recovery strain was held constant while the sample was heated to 42° C. for 120 seconds, causing a stress to develop. The sample was then unloaded at a rate of 0.5 MPa/min allowing the sample to perform a measurable amount of work as it retracted. Upon reaching a zero-stress condition, the crosshead was returned to its original zero-strain value, and the sample was allowed to continue to recover at room temperature for five minutes before starting the subsequent cycle. All cycles demonstrated nearly complete shape-recovery and high energy storage efficiency. The shape recovery can be attributed to the permanent, covalent network with a unimodal chain-length distribution that can allow all chains to more equally deform at high strain. The energy storage capacities of each cycle can be calculated by integrating force-versus-extension curves (FIG. 9) during the shape-recovery phase and dividing the result by the sample volume. The energy efficiency of each cycle can be calculated based on the ratio of the amount of work recovered to the amount of work input during cold-drawing.

Figure 10A:
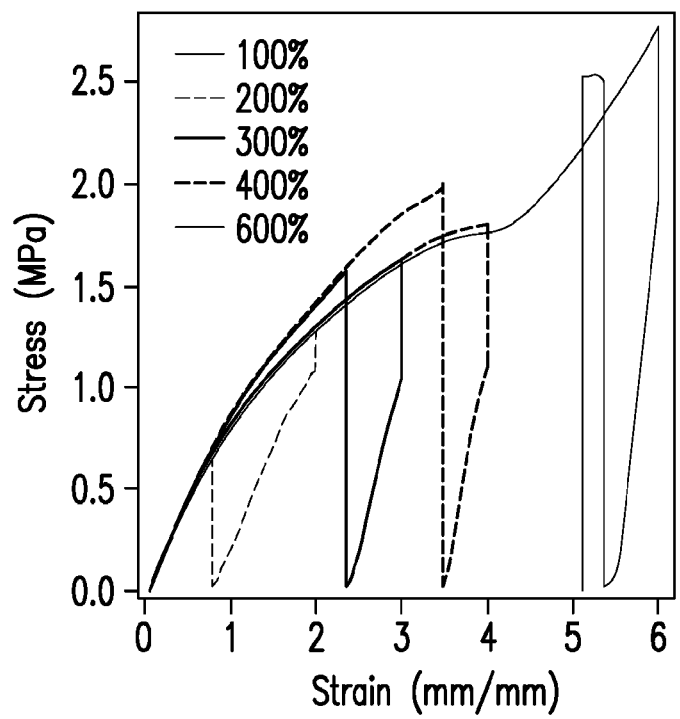
FIG. 10A displays the shape memory performance of a sample as a plot of stress versus strain for a sample drawn to different strains and triggered to shape recovery.
Figure 10B:
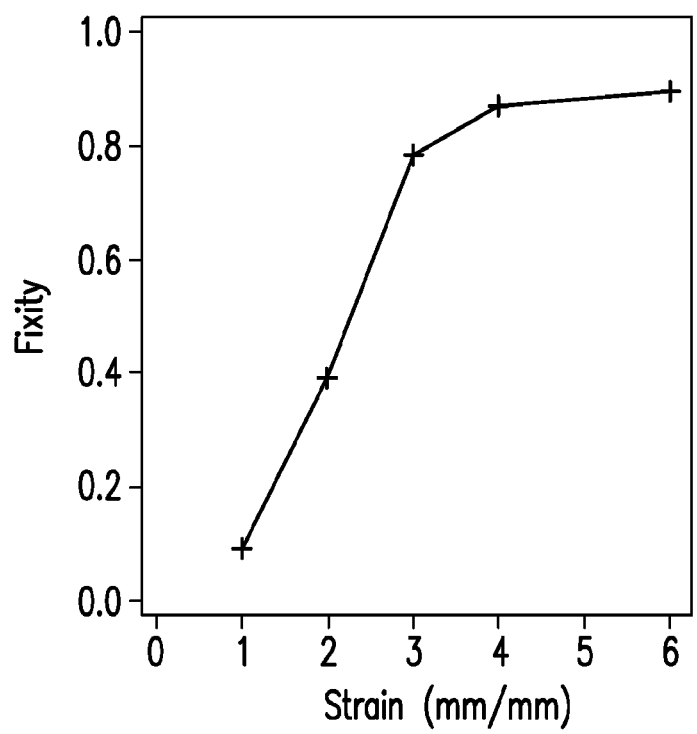
FIG. 10B displays the shape memory performance of a sample as a plot of the resulting shape fixity (strain fixity) corresponding to the various strains.

Strain-induced crystallization of PCL-4k-3T2A was studied by cold-drawing to different strains. Samples were drawn to 100%, 200%, 300%, 400%, or 600% strain at 15 mm/min (FIG. 10A). The strain fixities, $\varepsilon_f$, following cold-drawing were dependent on the strain the samples were drawn to (e.g., samples drawn to a higher strain showed a higher fixity). The samples drawn to a strain of 300% or more showed strain fixities of 80% or more (FIG. 10B).

One application of interest for the PCL-based shape-memory polymers discussed herein are compressive clothing or compressive therapy items. Further to this, a sample of the SMPs discussed herein were cold drawn to 400% strain and attached to a piece of fabric. The fabric-SMP sample can, for example, then be heated to perform work. In some examples, the PCL-based shape-memory polymers could be integrally formed with the fabric, or used in the absence of fabric to form compressive clothing or compressive therapy items. These samples, if triggered by body heat, could be used as compressive garments, such as compressive socks, that can be worn as part of compression therapy.

Discussed herein were well-defined shape memory networks formed by base-catalyzed reaction of thiol terminated poly(caprolactone)s, formed by reactions between acrylate terminated PCLs with non-crystalline spacers comprising multifunctional thiols, with multifunctional crosslinkers (e.g., multifunctional allylates). The resulting networks exhibited shape-memory properties, including cold-drawability, high shape fixity (strain fixity), shape recovery, and a capacity to store elastic energy. These shape-memory properties can be attributed to the network's high density of crystallizable chains, its homogeneous topography, and its uniform chain-length distribution. The incorporation of the non-crystalline spacers resulted in networks that can be triggered at temperatures around body temperature (e.g., ~30-35° C.). It was found that the length of the non-crystalline spacer can be systematically varied to affect the triggering temperature.

The methods and compositions of the appended claims are not limited in scope by the specific methods and compositions described herein, which are intended as illustrations of a few aspects of the claims and any methods and compositions that are functionally equivalent are within the scope of this disclosure. Various modifications of the methods and compositions in addition to those shown and described herein are intended to fall within the scope of the appended claims. Further, while only certain representative methods, compositions, and aspects of these methods and compositions are specifically described, other methods and compositions and combinations of various features of the methods and compositions are intended to fall within the scope of the appended claims, even if not specifically recited. Thus a combination of steps, elements, components, or constituents can be explicitly mentioned herein; however, all other combinations of steps, elements, components, and constituents are included, even though not explicitly stated.

What is claimed is:

1. A shape-memory polymer consists essentially of: a composite prepolymer crosslinked with a stoichiometric amount of a multifunctional isocyanate crosslinker, said composite prepolymer comprising a branched or telechelic polycaprolactone prepolymer having a low polydispersity reacted with a non-crystalline polyol chain extender.

2. The shape-memory polymer of claim 1, wherein the branched polycaprolactone prepolymer is present and comprises 3 or more branches.

3. The shape-memory polymer of claim 1, wherein the branched polycaprolactone prepolymer is present and each branch of the branched polycaprolactone prepolymer is substantially the same molecular weight.

4. The shape-memory polymer of claim 1, wherein the molecular weight of the branched polycaprolactone prepolymer or the telechelic polycaprolactone prepolymer is 6,000 g/mol or less, as determined by HNMR.

5. The shape-memory polymer of claim 1, wherein the molecular weight of each branch of the branched polycaprolactone prepolymer or the telechelic polycaprolactone prepolymer is 2,000 g/mol or less, as determined by HNMR.

6. The shape-memory polymer of claim 1, wherein the molecular weight of the non-crystalline polyol chain extender is from 50 g/mol to 1,200 g/mol.

7. The shape-memory polymer of claim 1, wherein the composite prepolymer comprises hydroxyl end groups;

wherein the molecular weight of the composite prepolymer is from 2,000 g/mol to 8,000 g/mol; wherein the composite prepolymer has a polydispersity index of from 1 to 2.0; or a combination thereof.

8. The shape-memory polymer of claim 1, wherein the multifunctional isocyanate crosslinker comprises 2 reactive groups.

9. The shape-memory polymer of claim 1, wherein the effective molecular weight between crosslinks of the shape-memory polymer is from 1,000 g/mol to 10,000 g/mol.

10. The shape-memory polymer of claim 1, wherein the shape-memory polymer comprises a residue of a free radical scavenger.

11. The shape-memory polymer of claim 1, wherein the shape-memory polymer has an elastic energy density of 1 $MJ/m^3$ or more; an energy storage efficiency of 50% or more; a strength of 1 MPa or more; a strain fixity of 65% or more; a stress free or unconstrained shape recovery ratio of 0.9 or more; a stress free or unstrained melting temperature of 40° C. or less as measured by differential scanning calorimetry; or a combination thereof.

12. A method of making the shape-memory polymer of claim 1, comprising: reacting a branched or telechelic polycaprolactone prepolymer having a low polydispersity with a non-crystalline polyol chain extender to form a composite prepolymer, and crosslinking stoichiometric amount of a multifunctional isocyanate crosslinker with the composite prepolymer, thereby forming the shape-memory polymer.

13. The method of claim 12, further comprising stretching the shape-memory polymer having an unstretched length to form a stretched shape-memory polymer having a post-stretched length.

14. The method of claim 13, wherein the post-stretched length is from 100% to 600% longer than the unstretched length.

15. The method of claim 13, further comprising heating the stretched shape-memory polymer to a temperature above the melting temperature of the stretched shape-memory polymer.

16. The method of claim 13, wherein the unstretched shape memory polymer has a stress free or unstained melting temperature of from 35° C. to 50° C. as measured by differential scanning calorimetry; wherein the stretched shape-memory polymer has a melting temperature of 40° C. or less as measured by differential scanning calorimetry; or a combination thereof.

* * * * *

UNITED STATES PATENT AND TRADEMARK OFFICE
CERTIFICATE OF CORRECTION

PATENT NO. : 10,647,812 B2
APPLICATION NO. : 15/579629
DATED : May 12, 2020
INVENTOR(S) : Anthamatten et al.

Page 1 of 1

It is certified that error appears in the above-identified patent and that said Letters Patent is hereby corrected as shown below:

In the Claims

Column 20, Line 17, Claim 16, cancel the text "unstained" and replace it with --unstrained--.

Signed and Sealed this
First Day of September, 2020

Andrei Iancu
*Director of the United States Patent and Trademark Office*